United States Patent
Sercel et al.

(10) Patent No.: US 8,867,872 B2
(45) Date of Patent: Oct. 21, 2014

(54) OPTICAL WAVEGUIDE SPLITTER ON A WAVEGUIDE SUBSTRATE FOR ATTENUATING A LIGHT SOURCE

(71) Applicant: HOYA Corporation USA, Santa Clara, CA (US)

(72) Inventors: Peter C. Sercel, Pasadena, CA (US); Toshiaki Sonehara, Monrovia, CA (US); Rolf A. Wyss, Glendale, CA (US)

(73) Assignee: HOYA Corporation USA, Santa Clara, CA (US)

(*) Notice: Subject to any disclaimer, the term of this patent is extended or adjusted under 35 U.S.C. 154(b) by 159 days.

(21) Appl. No.: 13/662,418

(22) Filed: Oct. 27, 2012

(65) Prior Publication Data

US 2013/0308897 A1    Nov. 21, 2013

Related U.S. Application Data

(60) Provisional application No. 61/553,133, filed on Oct. 28, 2011.

(51) Int. Cl.
*G02B 6/26* (2006.01)
*G02B 6/12* (2006.01)
(Continued)

(52) U.S. Cl.
CPC .. *G02B 6/12* (2013.01); *G02B 6/26* (2013.01); *G02B 6/4286* (2013.01);
(Continued)

(58) Field of Classification Search
CPC .............. G02B 6/12; G02B 6/26; G02B 6/13; G02B 6/42; G02B 6/10; G02B 6/12004; G02B 6/4204; G02B 6/122; G02B 6/262; G02B 6/4206; G02B 6/4286

USPC .......................... 385/14, 31, 32, 88, 129–132
See application file for complete search history.

(56) References Cited

U.S. PATENT DOCUMENTS 4,382,655 A   5/1983   Jamieson
4,750,799 A   6/1988   Kawachi et al.
(Continued)

FOREIGN PATENT DOCUMENTS

JP   2007-025371 A   2/2007
JP   2007-264487 A   10/2007
(Continued)

OTHER PUBLICATIONS

International Search Report & Written Opinion dated Mar. 20, 2013 in co-owned counterpart App No. PCT/US2012/062147.

(Continued)

*Primary Examiner* — Charlie Peng
*Assistant Examiner* — Mary El Shammaa
(74) *Attorney, Agent, or Firm* — David S. Alavi

(57) ABSTRACT

An optical apparatus comprises: source, primary, and secondary waveguides formed in waveguide layers on a substrate; a light source; and an optical waveguide tap. The light source launches a source optical signal along the source waveguide. The tap divides the source optical signal into a primary optical signal in the primary waveguide and a secondary optical signal in the secondary waveguide. The secondary optical signal emerges from the secondary waveguide to exit the waveguide layers at the substrate edge or to propagate within the waveguide layers as a stray optical signal without confinement by any waveguide. The stray optical signal propagates thusly unconfined into the open mouth of an optical trap that comprises one or more lateral surfaces formed in the waveguide layers and an opaque coating on the lateral surfaces, and comprises a spiral region of the optical waveguide layers with an open mouth and closed end.

22 Claims, 8 Drawing Sheets

(51) Int. Cl.
| | |
|---|---|
| *G02B 6/42* | (2006.01) |
| *G02B 6/293* | (2006.01) |
| *G02B 6/46* | (2006.01) |
| G02B 6/122 | (2006.01) |
| G02B 6/10 | (2006.01) |
| G02B 6/13 | (2006.01) |
| H01S 5/0683 | (2006.01) |
| H01S 5/00 | (2006.01) |

(52) U.S. Cl.
CPC .............. *G02B 6/29331* (2013.01); *G02B 6/46* (2013.01); *G02B 6/4204* (2013.01); *G02B 6/42* (2013.01); *G02B 6/262* (2013.01); *G02B 6/122* (2013.01); *G02B 6/10* (2013.01); *G02B 6/4206* (2013.01); *G02B 6/12004* (2013.01); *G02B 6/13* (2013.01); *H01S 5/0683* (2013.01); *H01S 5/0064* (2013.01)
USPC .................. 385/14; 385/31; 385/88; 385/129; 385/131

(56) References Cited

U.S. PATENT DOCUMENTS

| | | | |
|---|---|---|---|
| 5,082,340 | A | 1/1992 | Aoshima et al. |
| 5,133,029 | A | 7/1992 | Baran et al. |
| 5,375,178 | A | 12/1994 | Van Der Tol |
| 5,418,867 | A | 5/1995 | Van Der Tol |
| 5,555,088 | A | 9/1996 | Valette |
| 5,841,929 | A | 11/1998 | Komatsu et al. |
| 6,418,246 | B1 | 7/2002 | Gampp |
| 6,437,891 | B1 | 8/2002 | Chandrasekhar et al. |
| 6,885,795 | B1 | 4/2005 | Hsu et al. |
| 6,937,342 | B2 | 8/2005 | Osinski et al. |
| 6,959,138 | B2 | 10/2005 | Steenblik et al. |
| 7,221,845 | B2 | 5/2007 | Steenblik et al. |
| 7,276,770 | B1 | 10/2007 | Goushcha et al. |
| 7,330,619 | B2 | 2/2008 | Vernooy et al. |
| 7,340,114 | B2 | 3/2008 | Doi et al. |
| 7,530,693 | B2 | 5/2009 | Mihalakis |
| 7,606,499 | B2 | 10/2009 | Pan et al. |
| 7,813,604 | B2 | 10/2010 | Vernooy et al. |
| 7,945,132 | B2 | 5/2011 | Vernooy et al. |
| 2001/0009594 | A1 | 7/2001 | Hosoi |
| 2002/0102044 | A1 | 8/2002 | Barnard et al. |
| 2002/0137227 | A1 | 9/2002 | Weckstrom |
| 2004/0151460 | A1 | 8/2004 | Kitcher et al. |
| 2004/0213516 | A1 | 10/2004 | Gordon |
| 2005/0105842 | A1 | 5/2005 | Vonsovici et al. |
| 2006/0098929 | A1* | 5/2006 | Steenblik et al. ............. 385/131 |
| 2006/0203493 | A1 | 9/2006 | Brower et al. |
| 2007/0031083 | A1 | 2/2007 | Logvin et al. |
| 2007/0077008 | A1 | 4/2007 | Jeon et al. |
| 2007/0086708 | A1 | 4/2007 | Nojima et al. |
| 2007/0090542 | A1 | 4/2007 | Condie et al. |
| 2008/0019652 | A1 | 1/2008 | Steenblik et al. |
| 2008/0129997 | A1 | 6/2008 | Yi et al. |
| 2009/0015456 | A1 | 1/2009 | Moore |
| 2009/0067797 | A1* | 3/2009 | Peale ........................... 385/131 |
| 2009/0080084 | A1 | 3/2009 | Pang et al. |
| 2009/0116802 | A1 | 5/2009 | Kondou et al. |
| 2009/0207387 | A1* | 8/2009 | Eyal et al. .......................... 355/1 |
| 2011/0121181 | A1 | 5/2011 | Costello et al. |
| 2011/0268450 | A1 | 11/2011 | Paslaski et al. |
| 2011/0318016 | A1 | 12/2011 | Wyss et al. |
| 2012/0057880 | A1 | 3/2012 | Ruiz et al. |
| 2012/0251041 | A1 | 10/2012 | Ishikawa et al. |

FOREIGN PATENT DOCUMENTS

| | | |
|---|---|---|
| JP | 2010-511864 A | 4/2010 |
| JP | 2011-112844 A | 6/2011 |

OTHER PUBLICATIONS

Hu et al, "A Low-Loss and Compact Waveguide Y-Branch Using Refractive-Index Tapering", IEEE Photonics Technology Letters, vol. 9, No. 2, pp. 203-205 (Feb. 1997).

Rangaraj et al, "Low Loss Integrated Optical Y-Branch", Journal of Lightwave Technology, vol. 7, No. 5, pp. 753-758 (May 1989).

Shirafuji et al, "Transmission Characteristics of Optical Asymmetric Y Junction with a Gap Region", Journal of Lightwave Technology, vol. 9, No. 4, pp. 426-429 (Apr. 1991).

International Search Report & Written Opinion dated Jan. 10, 2012 in co-owned App No. PCT/US2011/041919.

Kawano et al, "Solar-light shielding using near-hemispherical Ian for a star sensor," Optical Engineering vol. 45 No. 12 p. 124403 (Dec. 2006).

\* cited by examiner

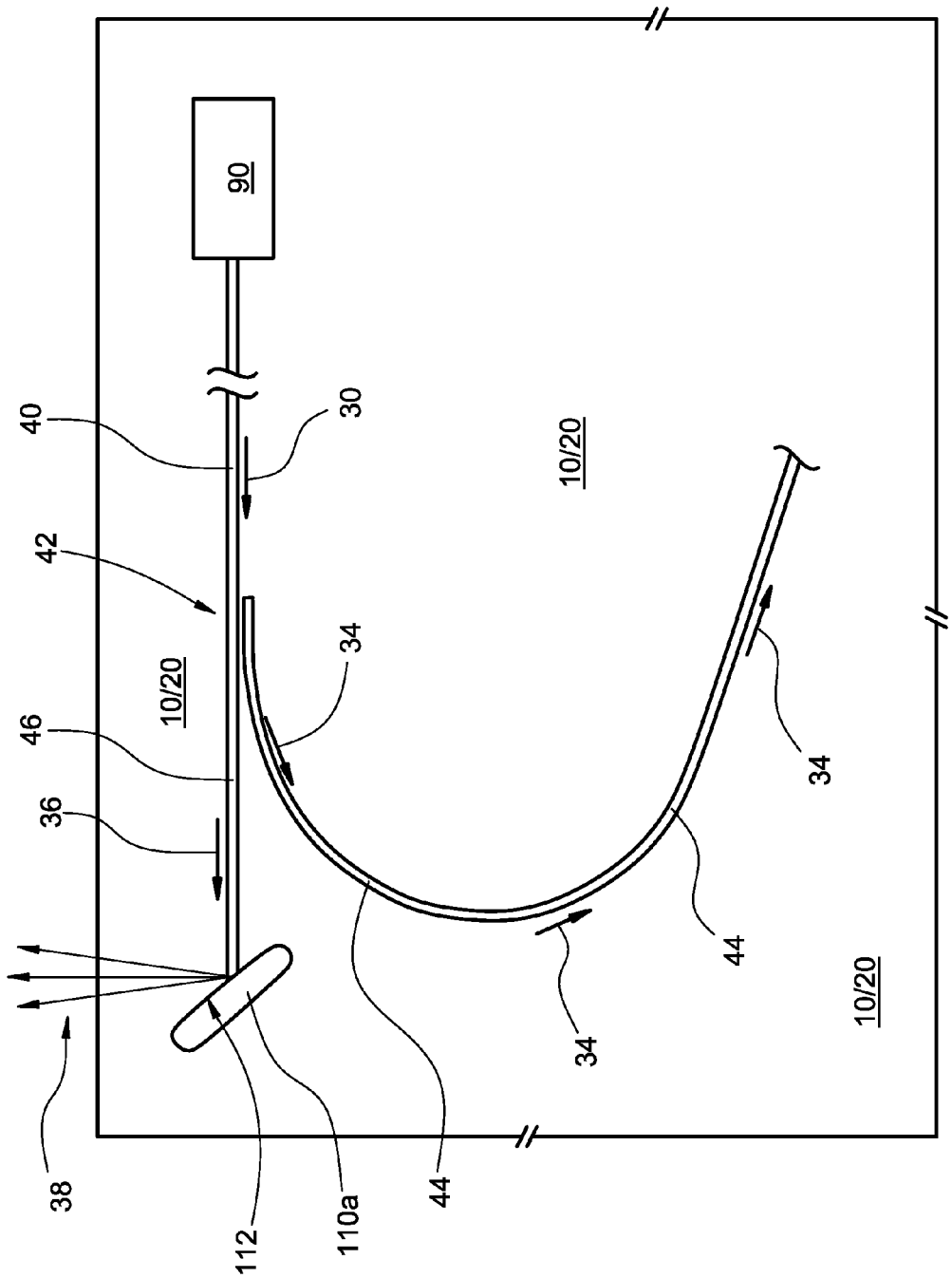

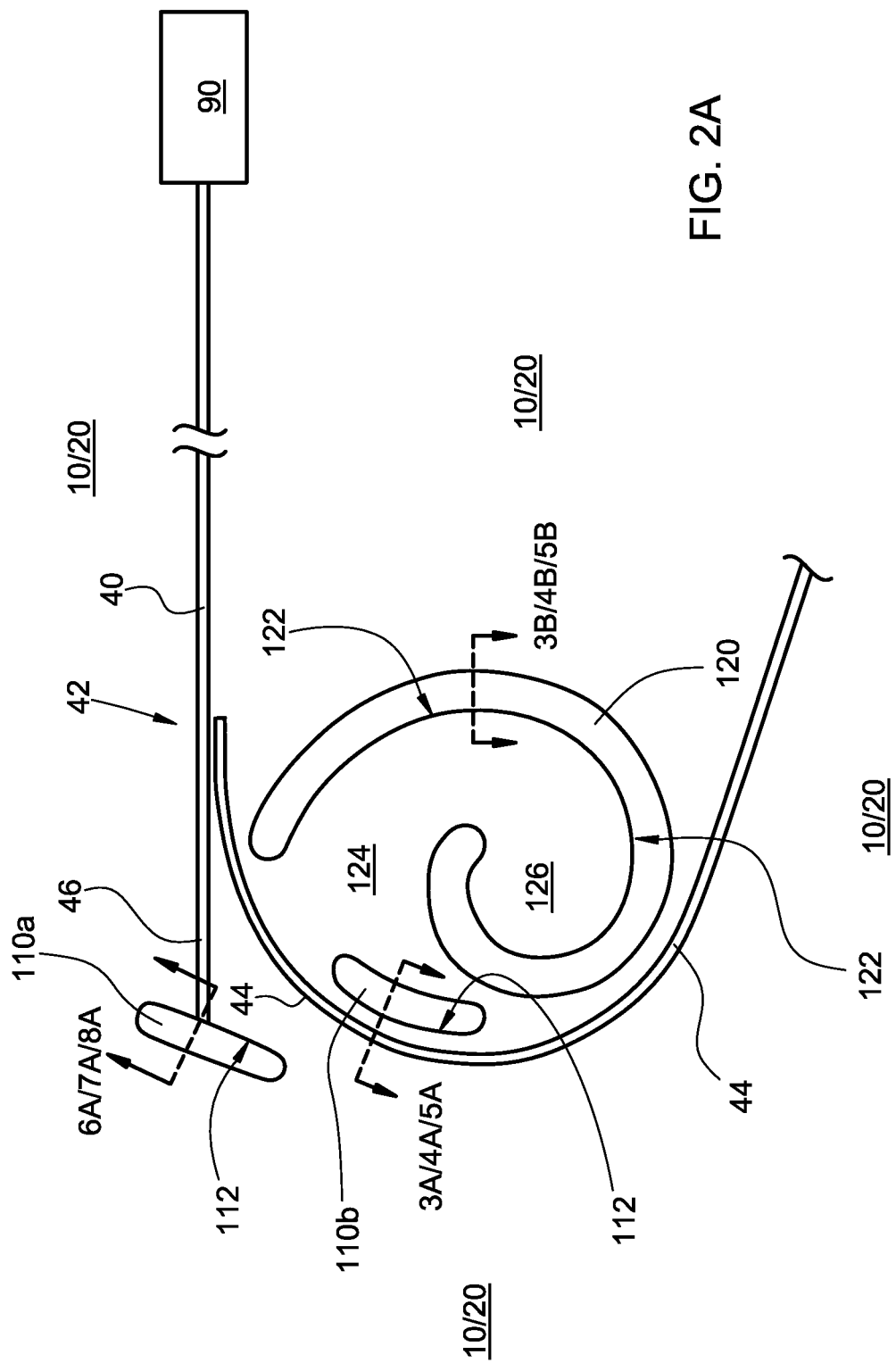

OPTICAL WAVEGUIDE SPLITTER ON A WAVEGUIDE SUBSTRATE FOR ATTENUATING A LIGHT SOURCE

BENEFIT CLAIMS TO RELATED APPLICATIONS

This application claims benefit of U.S. provisional App. No. 61/553,133 filed Oct. 28, 2011 in the names of Peter C. Sercel, Toshiaki Sonehara, and Rolf A. Wyss, said provisional application being hereby incorporated by reference as if fully set forth herein.

BACKGROUND

The field of the present disclosure relates to optical waveguides. In particular, apparatus and methods are described herein that employ a waveguide tap or splitter on a waveguide substrate for attenuating the output of a light source.

A common configuration for an optoelectronic device includes a substrate on which are formed one or more optical waveguides, and at least one light source positioned (perhaps mounted on the substrate) to launch at least a portion of its optical output signal into an optical waveguide on the substrate. The optical signal thus launched propagates along the optical waveguide in a corresponding guided optical mode that is substantially confined in two transverse dimensions.

In many instances, a standard light source (e.g., a laser diode) is incorporated into the assembled optoelectronic device; the standard light source might be manufactured by the same manufacturer that assembles the optoelectronic device, or might be obtained from a different manufacturer of merchant or OEM light sources. In some cases, the optimum operating output power of the standard laser diode is larger than the maximum optical signal power permitted or desired in or from the optoelectronic device (e.g., to comply with an established industry standard). Operating the laser diode at reduced output power, by reducing the drive current to a level that is not sufficiently above its lasing threshold current, can reduce the maximum speed or frequency at which the laser output can be modulated, or can reduce the risetime or introduce timing jitter at the leading edge of a modulated waveform. Operating at reduced current might also introduce spectral changes, power fluctuations, or other undesirable fluctuations or instabilities, or might require more precise control of DC laser bias current or modulation current amplitude to maintain a fixed extinction ratio.

Redesigning the laser diode to run optimally at lower output power, or re-sourcing a merchant laser diode to replace it with a different one that operates at lower output power, can incur significant costs, risks, and penalties, both technical and commercial. A more straightforward approach might include intentional introduction of an optical loss element into the optical waveguide to reduce the power level of the propagating optical signal after it leaves the laser diode. In that way the standard laser diode or other light source can be operated at its optimal power level, but only a desired fraction of that output power propagates beyond the optical loss element.

SUMMARY

An optical apparatus comprises: a waveguide substrate; one or more optical waveguide layers on the substrate; source, primary, and secondary waveguides formed in the waveguide layers; a light source; and an optical waveguide tap. The apparatus can further comprise one or more light traps. Each of the waveguides is arranged to substantially confine in two transverse dimensions a corresponding guided optical mode. The light source emits an optical signal and is arranged to launch a portion of the optical signal to propagate along the source waveguide as a source optical signal in the corresponding guided optical mode. The optical waveguide tap is formed in one or more of the optical waveguide layers and is arranged (i) to direct a primary fraction of the source optical signal to propagate along the primary waveguide as a primary optical signal and (ii) to direct a secondary fraction of the source optical signal to propagate along the secondary waveguide as a secondary optical signal. Each light trap is formed in the optical waveguide layers and comprises one or more lateral surfaces of the optical waveguide layers and a substantially opaque coating on the lateral surfaces.

The secondary waveguide can be arranged so that the secondary optical signal propagates to an end of the secondary waveguide, propagates to an edge of the waveguide substrate, and emerges from the optical waveguide layers.

The lateral surfaces of each light trap can be arranged to define a corresponding spiral region of the optical waveguide layers; the region includes an open mouth and closed end of the light trap. The secondary waveguide can be arranged so that the secondary optical signal propagates to an end of the secondary waveguide and emerges from the secondary waveguide to propagate as a stray optical signal in one or more of the optical waveguide layers without confinement by any of the optical waveguides in the corresponding guided optical modes. The secondary waveguide and the light trap can be arranged on the waveguide substrate so that the stray optical signal propagates into the open mouth of the optical trap without confinement by any of the optical waveguides in the corresponding guided optical modes.

Objects and advantages pertaining to attenuating an optical signal propagating in a waveguide using a waveguide tap or a light trap may become apparent upon referring to the exemplary embodiments illustrated in the drawings and disclosed in the following written description or appended claims.

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIG. 1B is a schematic plan view of another exemplary arrangement of a light source, waveguide, and waveguide tap on a waveguide substrate.

FIG. 2A is a schematic plan view of a light source, waveguide, and exemplary light-trapping structure on a waveguide substrate.

Figure 1A:
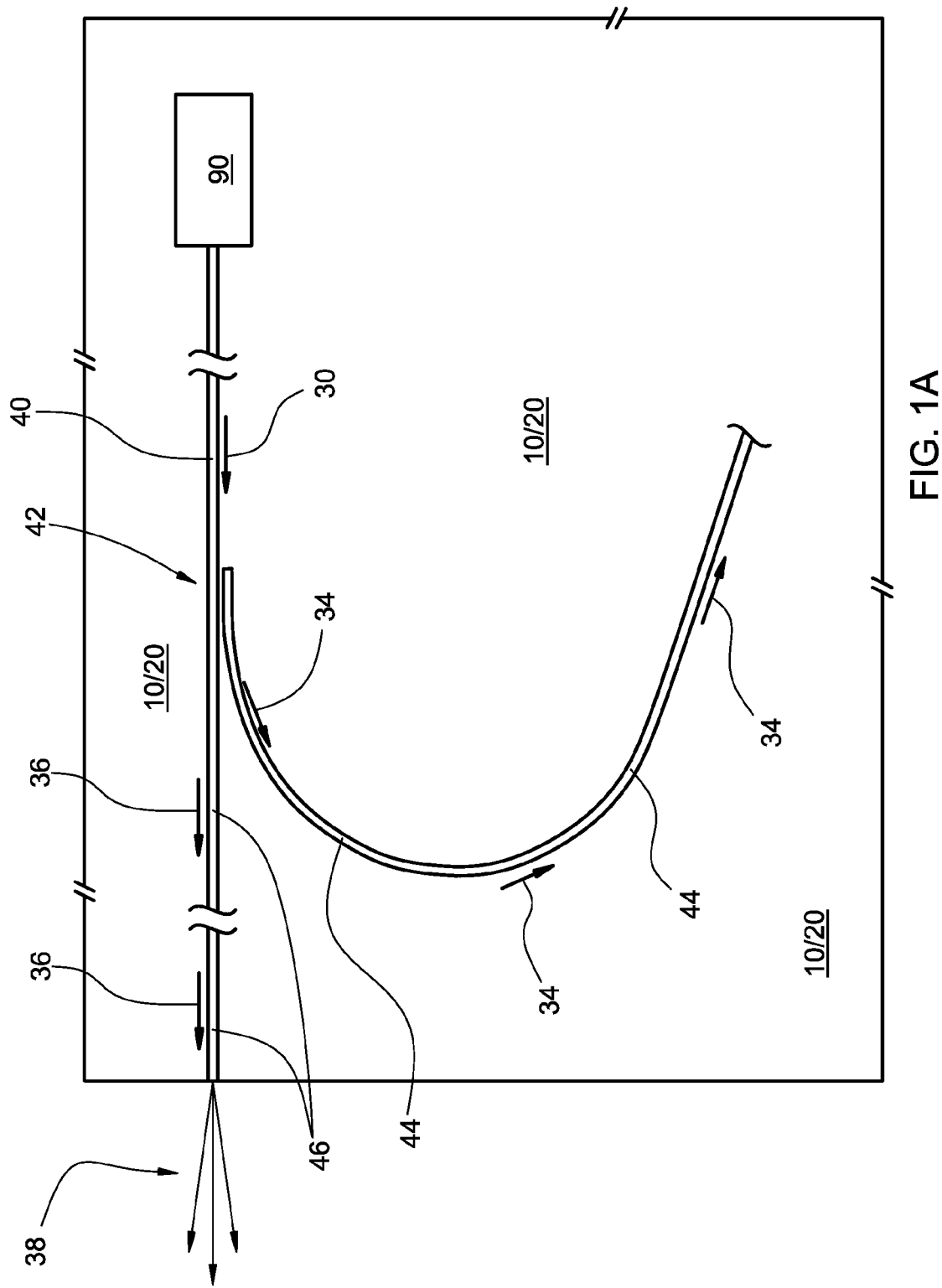
FIG. 1A is a schematic plan view of an exemplary arrangement of a light source, waveguide, and waveguide tap on a waveguide substrate.

The embodiments depicted in this disclosure are shown only schematically, and not all features may be shown in full detail or in proper proportion. Certain features or structures may be exaggerated relative to others for clarity. The drawings should not be regarded as being to scale. The embodiments shown are exemplary only, and should not be construed as limiting the scope of the written description or appended claims.

DETAILED DESCRIPTION OF EMBODIMENTS

As noted above, it may be desirable in some optoelectronic devices (i) to employ a light source that, when operated in its optimal output power range, delivers more optical signal power than is permitted or desired in or from the optoelectronic device, and (ii) to intentionally introduce loss into an optical waveguide on a waveguide substrate so as to reduce the optical signal power to a desired or permitted level while still operating the light source in its optimal range. In the exemplary embodiments of the present disclosure, an optical loss element in the optical waveguide carrying the optical signal (referred to herein as the source waveguide) comprises a waveguide tap formed in waveguide layers on the waveguide substrate. The waveguide tap (equivalently, waveguide splitter) is arranged to direct a desired fraction of the optical signal power from the source waveguide into a secondary optical waveguide. That secondary waveguide terminates, allowing the diverted portion of the optical signal to freely propagate within the waveguide substrate, within layers on the waveguide substrate, or out of the waveguide substrate. The fraction of the optical signal directed into the secondary waveguide shall be referred to herein as the secondary fraction (equivalently, the dumped fraction); the remaining fraction is directed into a primary waveguide and shall be referred to herein as the primary fraction. The primary fraction of the optical signal represents the desired optical output of the optoelectronic device.

In any embodiment of an optoelectronic device according to the present disclosure, any suitable waveguide tap or splitter can be employed, and can be arranged to divide between the primary and secondary waveguides any desired fractions of the optical signal power propagating along the source waveguide. Examples are disclosed in, e.g., co-owned U.S. Pat. Nos. 7,330,619, 7,813,604, and 7,945,132, each of which is incorporated by reference as if fully set forth herein. Other examples are disclosed in, e.g.:

U.S. Pat. No. 4,750,799 entitled "Hybrid optical integrated circuit";

U.S. Pat. No. 5,133,029 entitled "Adiabatic polarization splitter";

U.S. Pat. No. 5,375,178 entitled "Integrated optical polarization manipulating device";

U.S. Pat. No. 5,418,867 entitled "Integrated optical device for manipulating the polarization of optical signals";

U.S. Pat. No. 6,885,795 entitled "Waveguide tap monitor";

U.S. Pat. No. 7,340,114 entitled "Optical waveguide device and optical modulator";

Hu et al, "A Low-Loss and Compact Waveguide Y-Branch Using Refractive-Index Tapering", IEEE Photonics Technology Letters, vol. 9, No. 2, pp. 203-205 (February 1997);

Rangaraj et al, "Low Loss Integrated Optical Y-Branch", Journal of Lightwave Technology, vol. 7, No. 5, pp. 753-758 (May 1989); and Shirafuji et al, "Transmission Characteristics of Optical Asymmetric Y Junction with a Gap Region", Journal of Lightwave Technology, vol. 9, No. 4, pp. 426-429 (April 1991), each of which is incorporated by reference as if fully set forth herein. In some examples the core of the primary or secondary waveguide is a continuous extension of the core of the source waveguide; in some examples the core of the primary or secondary waveguide is discrete from but optically coupled to the core of the source waveguide. Any suitable waveguide tap or splitter arrangement, including those examples cited above, shall fall within the scope of the present disclosure or appended claims.

The optical waveguides (source, primary, secondary, and other waveguides, if present, formed on the waveguide substrate as part of the optoelectronic device) typically are formed in one or more layers of suitable core or cladding materials grown, deposited, or otherwise formed on the substrate; those layers can be referred to collectively as optical waveguide layers. The waveguide substrate acts as a structural support for the optical waveguide layers. While the waveguides are formed, strictly speaking, in the optical waveguide layers, they may also be referred to herein (equivalently if somewhat less precisely) as being formed on the waveguide substrate. The light source is mounted on the waveguide substrate, directly or on one or more of the optical waveguide layers, and can be configured and positioned in any suitable way for launching at least a portion of its optical output signal into one of the waveguides formed in the optical waveguide layers. Spatially selective processing of one or more of the optical waveguide layers (by deposition, removal, or alteration of material) defines the optical waveguides; those processed layers (or processed regions of those layers) often act as waveguide cores having a refractive index somewhat higher than surrounding layers, which act as waveguide cladding. A typical waveguide substrate can include regions having only cladding layers and other regions having one or more core layers in addition to cladding layers. In some examples of waveguides formed on substrates (e.g., co-owned U.S. Pat. Nos. 6,975,798; 7,136,564; 7,164,838; 7,184,643; 7,373,067; 7,394,954; 7,397,995; or 7,646,957, or co-owned Pub. No. 2010/0092144, each of which is incorporated by reference as if fully set forth herein), distinct regions can have differing numbers of core or cladding layers present, with the waveguide typically being defined by those regions where certain sets of core layers are present. Any suitable core/cladding configurations can be employed within the scope of the present disclosure or appended claims.

Once propagating along the secondary waveguide, the secondary fraction of the optical signal is discarded (i.e., the dumped fraction is dumped). However, the dumped secondary fraction must be suitably managed so as to reduce or eliminate potential degradation of the performance of the optoelectronic device (e.g., via optical feedback to the light source or optical cross-talk). A portion of the dumped fraction of the optical signal, propagating as a stray optical signal in the optical waveguide layers but not guided by a waveguide core, can cause a variety of problems in the optoelectronic device. For example, a stray optical signal that propagates back to the light source can cause instabilities or fluctuations through unwanted optical feedback. In another example, if a monitor photodetector is used for electronic feedback control of the light source, a stray optical signal that reaches the monitor photodetector can disrupt that feedback control. In another example, if the optoelectronic device is a bidirectional device (e.g., a bidirectional transceiver comprising both a transmitting light source and a receiving photodetector), then a stray optical signal that reaches the receiving photodetector can interfere with reception of a received optical signal (a problem known as optical cross-talk and often quantified as a so-called "cross-talk penalty"). Those and other problems can be reduced, eliminated, or mitigated by limiting or containing the propagation in the waveguide layers of the dumped secondary fraction of the optical signal as a stray optical signal.

Control of propagation in the waveguide layers of the dumped secondary fraction as a stray optical signal can be achieved by routing the secondary waveguide toward an edge of the waveguide substrate, as schematically illustrated in the exemplary arrangements of FIGS. 1A and 1B. An optical source waveguide 40 of any suitable type or configuration is formed in optical waveguide layers 20 on a waveguide substrate 10. The optical waveguide layers 20 and the waveguide substrate 10 can comprise any of myriad suitable materials while remaining within the scope of the present disclosure or appended claims. In a common implementation, substrate 10 comprises silicon, and the waveguide layers 20 can include one or more of silica, doped silica, silicon nitride, or silicon oxynitride. Some suitable examples of optical waveguides are disclosed in co-owned patents and published applications cited above. Other waveguide layer compositions and arrangements can be employed (e.g.: one or more inorganic, doped or undoped, dielectric, core or cladding material; one or more polymer or organic, doped or undoped, dielectric, core or cladding material; silicon or other doped or undoped inorganic semiconductor core material(s) in silica or other doped or undoped inorganic dielectric cladding material(s); doped or undoped, polymer or organic, semiconductor core material(s) in doped or undoped, polymer or organic, dielectric cladding material(s); or combinations or functional equivalents thereof).

A light source 90 can be positioned on substrate 10 or on one or more of the waveguide layers 20, and is positioned to launch an optical signal 30 to propagate along optical source waveguide 40 as a guided optical mode substantially confined by the waveguide 40 in two transverse dimensions. Alternatively, the light source 90 can be located elsewhere (i.e., not mounted on the substrate 10) and the optical signal 30 can be conveyed by any suitable optical arrangement (e.g., using a lens) to be launched to propagate along optical source waveguide 40. The light source 90 can comprise any source of optical signal 30, such as a laser diode or light-emitting diode; such a light source often exhibits reduced modulation speed or undesirable shifts, fluctuations, or instabilities of performance characteristics when operated below its optimal output power range. Laser diodes can be particularly susceptible to such undesirable behaviors when operated at lower-than-optimal output power or too near their lasing threshold currents.

A waveguide tap 42 is formed in the waveguide layers 20 and couples the source waveguide 40 with a primary optical waveguide 44 and a secondary optical waveguide 46, which are also formed in the waveguide layers 20. The waveguide tap 42 is arranged to divide the optical signal 30 guided by the source waveguide 40 into a primary optical signal 34 guided by the primary waveguide 44 and secondary optical signal 36 guided by the secondary waveguide 46. The tap 42 is arranged so that the primary optical signal 34 falls within a desired output power range for the optoelectronic device when the light source 90 operates within its optimal output power range. The dumped secondary optical signal 36 is often between about 50% and about 99% of the optical signal 30, typically between about 70% and about 95%, and preferably between about 80% and about 90%; other so-called tap ratios can be employed as needed or desired in a particular circumstance. Any suitable type or arrangement of waveguide tap can be employed. In one example, mode-interference coupling can be employed (e.g., as in U.S. Pat. No. 7,330,619 noted above) to divide the optical signal 30 into primary and secondary optical signals 34 and 36. In such an example, a desired tap ratio can be implemented by forming the waveguide tap 42 with, e.g., a suitable gap between the waveguide tap segments in a coupling region, a suitable length of the coupling region, and so on.

In FIG. 1A, the secondary waveguide 46 is routed to an edge of the waveguide substrate 10 and waveguide layers 20, and the dumped secondary fraction 36 of the optical signal propagates to the end of the secondary waveguide 46 and then propagates into the surroundings as an unconfined stray optical signal 38. The core of the waveguide 36 can be terminated by the edge of the waveguide layers 20, or the core can terminate at some desired distance from the edge (not shown). Terminating the core of the secondary waveguide 46 at the edge can result in less of the optical signal 36 escaping into the waveguide layers 20; terminating the core before it reaches the edge permits the dumped optical signal 36 to diverge before reaching the edge, thereby reducing the power density and the likelihood of damage or undesirable localized heating of the waveguide layers 20 or the substrate 10 (if those are a concern).

An index matching medium can be employed to reduce internal reflection of the secondary optical signal 36 by the edge of the waveguide layers 20. Such an internally reflected optical signal can propagate in the optical waveguide layers 20 without confinement by any waveguide, which can be undesirable (see below). Instead or in addition, the waveguide 46 can be arranged so that the secondary optical signal exits the waveguide layers 20 at Brewster's angle to reduce the amount of that signal reflected back into the waveguide layers 20. If an index matching medium is employed, it can include an optical absorber that absorbs the stray optical signal 38 once it exits the waveguide layers and enters the surrounding medium. By conveying the dumped secondary optical signal 36 out of the waveguide layers 20, the likelihood of degradation by that signal of the operation of the optoelectronic device (e.g., via optical feedback to the light source or optical cross-talk) can be reduced.

Another exemplary arrangement of an optoelectronic device is illustrated schematically in FIG. 1B, in which the dumped secondary optical signal 36 exits the secondary waveguide 36 and propagates as a stray optical signal 38 in the optical waveguide layers 20 without confinement by any waveguide. A light collector 110a is formed in the waveguide layers 20 on the waveguide substrate 10. The structure of the light collector 110a is described below and illustrated schematically in the sectional views of FIGS. 6A/6B, 7A/7B, and 8A/8B. In this example the light collector 110a is arranged to reflect the stray optical signal 38 to propagate toward an edge of the waveguide layers 20 (without confinement by any of the optical waveguides in the corresponding guided optical modes) and into the surrounding medium. The surrounding medium can be index matched, optically absorbing, or both, as described above; the waveguide 46 and light collector 110*a* can be arranged so that the optical signal 38 exits the waveguide layers 20 at Brewster's angle, as described above.

In some optoelectronic devices, the arrangements of FIG. 1A or 1B might be sufficient for reducing to an operationally acceptable level unconfined propagation of the stray optical signal 38 in the waveguide layers 20. In other instances, more stringent requirements might necessitate additional measures to reduce further such unconfined propagation of the stray optical signal 38 in the waveguide layers 20. Further reduction of propagation in the waveguide layers 20 of the dumped secondary fraction 36 as an unconfined stray optical signal 38 can be achieved by providing one or more additional light-collecting or light-trapping structures formed in the waveguide layers 20 that are arranged to collect or trap the dumped secondary fraction of the optical signal that emerges from an end of the secondary waveguide. Some examples of such structures are disclosed in one or more of the following co-owned applications:

- U.S. provisional App. No. 61/358,877 filed Jun. 25, 2010 entitled "Light-trapping structure on a waveguide substrate";
- U.S. provisional App. No. 61/380,310 filed Sep. 6, 2010 entitled "Multi-function encapsulation for a multi-channel optoelectronic device";
- U.S. non-provisional application Ser. No. 13/096,648 filed Apr. 28, 2011 entitled "Cross-talk reduction in a bidirectional optoelectronic device";
- U.S. non-provisional application Ser. No. 13/168,936 filed Jun. 25, 2011 entitled "Cross-talk reduction in a bidirectional optoelectronic device"; and
- U.S. non-provisional application Ser. No. 13/225,723 filed Sep. 6, 2011 entitled "Cross-talk reduction in a bidirectional optoelectronic device."

Each of said applications is incorporated by reference as if fully set forth herein. Other examples of light-trapping structures (not all of which are formed on waveguide substrates) are disclosed in:

- U.S. Pat. No. 6,418,246 entitled "Lateral trenching for cross coupling suppression in integrated optical chips" issued Jul. 9, 2002 to Gampp;
- U.S. Pat. No. 6,959,138 entitled "Planar optical waveguide" issued Oct. 25, 2005 to Steenblik et al;
- U.S. Pat. No. 7,221,845 entitled "Planar optical waveguide" issued May 22, 2007 to Steenblik et al;
- U.S. Pat. No. 7,276,770 entitled "Fast Si diodes and arrays with high quantum efficiency built on dielectrically isolated wafers" issued Oct. 2, 2007 to Goushcha et al;
- U.S. Pat. No. 7,530,693 entitled "Single MEMS imager optical engine" issued May 12, 2009 to Mihalakis;
- U.S. Pat. Pub. No. 2002/0137227 entitled "Chemiluminescent gas analyzer" published Sep. 26, 2002 in the name of Weckstrom;
- U.S. Pat. Pub. No. 2004/0151460 entitled "Deep trenches for optical and electrical isolation" published Aug. 5, 2004 in the names of Kitcher et al;
- U.S. Pat. Pub. No. 2005/0105842 entitled "Integrated optical arrangement" published May 19, 2005 in the names of Vonsovici et al;
- U.S. Pat. Pub. No. 2008/0019652 entitled "Planar optical waveguide" published Jan. 24, 2008 in the names of Steenblik et al; and
- U.S. Pat. Pub. No. 2009/0080084 entitled "Beam dump for a very-high-intensity laser beam" published Mar. 26, 2009 in the names of Pang et al.

Figure 2B:
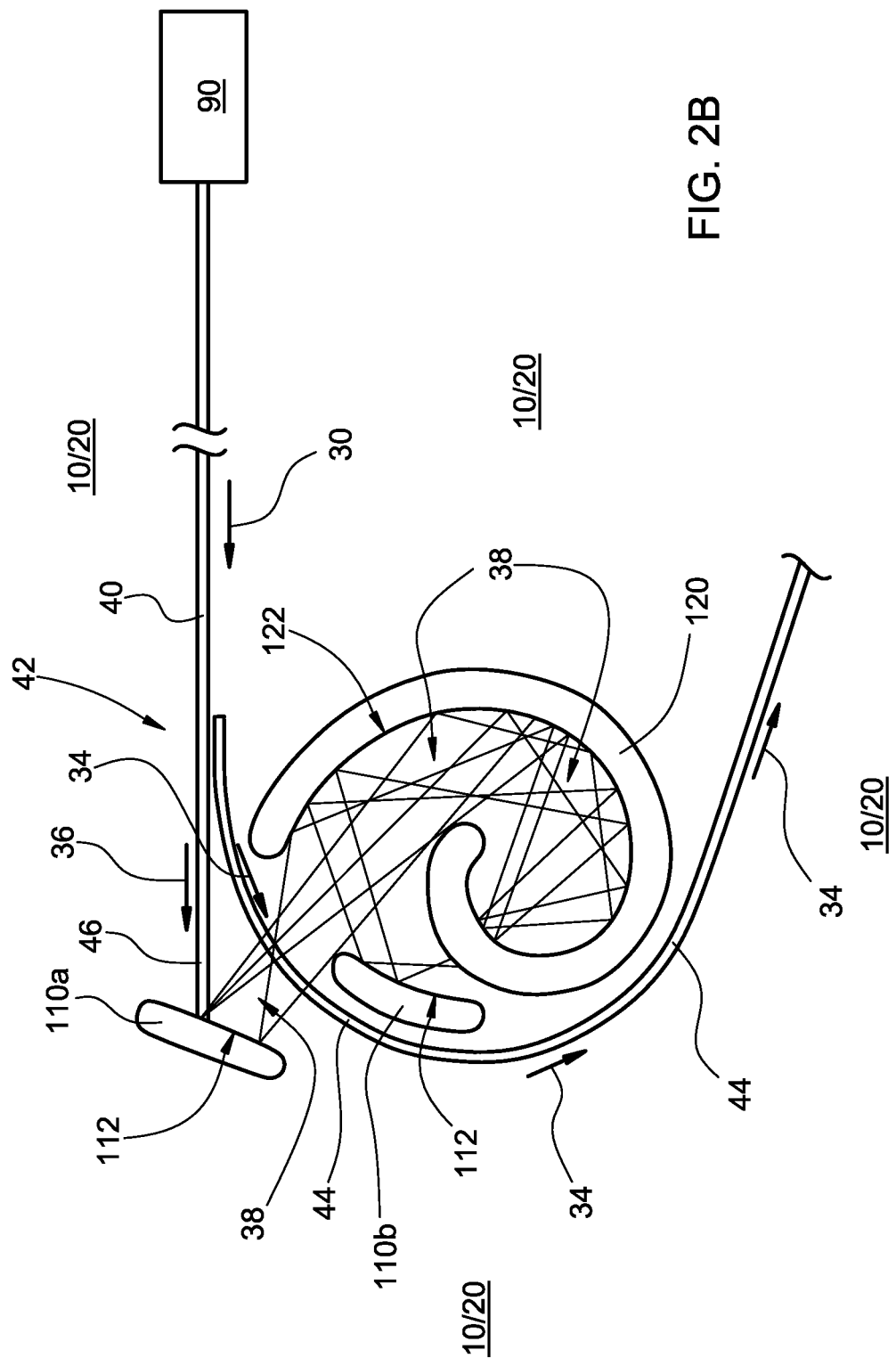
FIG. 2B is a schematic plan view of the light source, waveguide, and exemplary light-trapping structure of FIG. 2A showing paths of guided and stray optical signals.
Figure 3A:
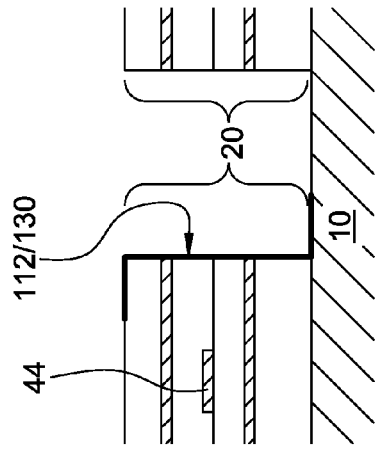
FIGS. 3A, 4A, and 5A are schematic cross-sectional views of various exemplary lateral surfaces of the optical waveguide layers and substantially opaque coatings formed near an optical waveguide.

FIGS. 2A and 2B illustrate schematically a waveguide tap and a light-trapping structure (i.e., one or more light collectors and one or more light traps) formed on a waveguide substrate or optical waveguide layers thereon. FIGS. 3A/3B, 4A/4B, 5A/5B, 6A/6B, 7A/7B, and 8A/8B are schematic sectional views of various waveguide layer lateral surfaces or end faces.

Figure 3B:
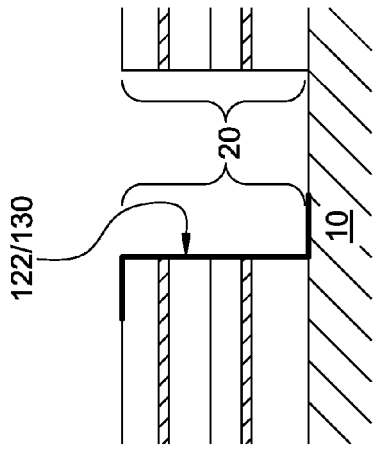
FIGS. 3B, 4B, and 5B are schematic cross-sectional views of other various exemplary lateral surfaces of the optical waveguide layers and substantially opaque coatings formed away from any optical waveguide.

Without any light-trapping structure, a stray optical signal 38 emerging from waveguide 46 can propagate through the optical waveguide layers 20 and can in some instances interfere with or disrupt the performance of other optical components of the optoelectronic device on the substrate 20, e.g., if the arrangements of FIG. 1A or 1B do not reduce sufficiently the level of the stray optical signal 38. FIGS. 2A and 2B illustrate schematically a light-trapping structure that includes light collectors 110*a*/110*b* (referred to generically as light collector 110*x* or collectively as light collectors 110) and a light trap 120, although the distinction between the light collectors 110 and light trap 120 is somewhat artificial in some arrangements. Two light collectors 110 and one light trap 120 are shown in the exemplary embodiment of the drawings; any suitable number of one or more light collectors or one or more light traps can be employed within the scope of the present disclosure or appended claims. Each light collector 110*x* comprises one or more lateral surfaces 112 of the optical waveguide layers 20 and a substantially opaque coating 130 on the lateral surfaces 112 (FIGS. 3A/4A/5A, which show the lateral surfaces 112 near various types of waveguide cores). Each light trap 120 comprises one or more lateral surfaces 122 of the optical waveguide layers 20 and a substantially opaque coating 130 on the lateral surfaces 122 (FIGS. 3B/4B/5B, which show various core layers or cladding layers near lateral surface 112, but no waveguide core nearby). The lateral surfaces 112/122 typically are substantially perpendicular to the substrate 10 and optical waveguide layers 20, i.e., they are substantially vertical relative to the horizontal substrate 10. The designations horizontal and vertical are relative and are not intended to designate absolute spatial orientation. Although FIGS. 3A/4A/5A show the lateral surface 112 formed near a waveguide 44 (as is the case for light collector 110*b*, for example), a light collector 110*x* can be formed in any suitable location on substrate 10, including locations away from any waveguide (which would therefore resemble FIGS. 3B/4B/5B). Likewise, although FIGS. 3B/4B/5B show the lateral surface 122 formed away from any waveguide core, a light trap 120 can be formed in any suitable location on substrate 10, including locations near a waveguide 40, 44, or 46 (which would therefore resemble FIGS. 3A/4A/5A).

The dumped secondary optical signal 36 propagates to the end of the secondary waveguide 46, enters the waveguide layers 20, and propagates away from the end face of secondary waveguide 46 within the optical waveguide layers 20 as stray optical signal 38. In the example of FIGS. 2A and 2B, the lateral surface 112 of light collector 110*a* forms the end face of secondary waveguide 46 (similar to FIG. 1B). When the stray optical signal 38 encounters a lateral surface 112 with a substantially opaque coating 130, it is prevented from propagating further in that direction. The coating 130 typically absorbs a fraction of the incident light and reflects the rest, which propagates as the stray optical signal 38. The lateral surface 112 of the light collector 110*a* is arranged to direct the reflected portion of the stray optical signal toward the light trap 120 (either directly, as shown, or after redirection by another light collector 110*x*, not shown).

Figure 6A:
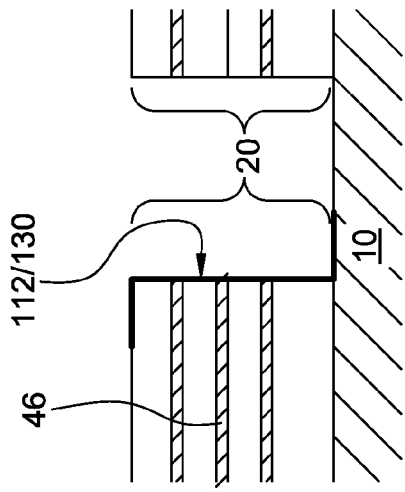
FIGS. 6A, 7A, and 8A are schematic longitudinal sectional views of end faces of various exemplary optical waveguides and substantially opaque coatings formed on the end faces.
Figure 6B:
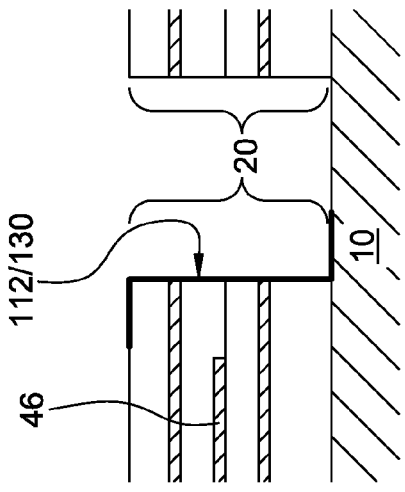
FIGS. 6B, 7B, and 8B are schematic longitudinal sectional views of end faces of other various exemplary optical waveguides and substantially opaque coatings formed on the end faces.

The core of the secondary waveguide 46 can extend all the way to the end face formed by lateral surface 112 of light collector 110*a*, as shown schematically in the longitudinal sections of FIGS. 6A/7A/8A (which show various types of waveguides terminating at surface 112). The stray optical signal 38 emerging from the secondary waveguide 46 is immediately reflected by surface 112 and coating 130 and propagates within core layers 20 without lateral confinement by a waveguide. Alternatively, the core of secondary waveguide 46 can stop short of the lateral surface 112 of the light collector 110a, as shown schematically in the longitudinal sections of FIGS. 6B/7B/8B (which show various types of waveguides terminating near surface 112). In that arrangement the stray optical signal 38 begins to diverge within the waveguide layers 20 before being blocked and reflected by surface 112 and coating 130. In any of these examples, any end face of secondary waveguide 46 is oriented off-normal from the propagation direction defined by the secondary waveguide, so as to substantially avoid retroreflection of a portion of the secondary optical signal backward to propagate along secondary waveguide 46 as a guided optical mode.

The lateral surfaces 122 and substantially opaque coatings 130 of the light trap 120 define a corresponding spiral region of the optical waveguide layers 20. That spiral region includes an open mouth 124 and a closed end 126. Portions of the stray optical signal 38 that propagate in the optical waveguide layers 20 into the open mouth 124 are repeatedly reflected from the surface 122 and coating 130 further into the spiral region until reaching the closed end 126 (as shown in FIG. 2B). Typically, upon each reflection a portion of the stray optical signal 34 is absorbed and the rest is reflected. The spiral region can be arranged in any suitable way, and typically subtends an arc greater than about 180°. In some embodiments, the spiral region can be a cornuate spiral region (i.e., a tapered, horn-shaped spiral that tapers toward the closed end 126).

The substantially opaque coating 130 typically is arranged to exhibit optical absorption over the operational wavelength range of the light source 90, to effect attenuation of the stray optical signal 38 as it is repeatedly reflected from lateral surfaces 112/122. A metal coating can often be employed to provide substantial opacity and a suitable degree of optical absorption. In one example, chromium or titanium can be employed over an operational wavelength range of about 1200-1700 nm; any other suitable metal usable over any other suitable wavelength range shall fall within the scope of the present disclosure or appended claims. A thickness of coating 130 greater than about 150 nm can typically provide a sufficient degree of opacity, and larger thicknesses can be employed to ensure adequate opacity. In one example, wherein a chromium or titanium layer is deposited on the lateral surfaces 112/122 of optical waveguide layers 20 that comprise, e.g., silica, silicon nitride, or other dielectric materials of similar refractive index, about 45% of the incident stray optical signal 38 is absorbed and about 55% of the stray optical signal 38 is reflected. Each ray representing the stray optical signal 38 undergoes 4 to 6 or more reflections before reaching the closed end 126 of the light trap 120, so that only about 3% (after 6 reflections) to about 9% (after 4 reflections) of the original optical power remains in the stray optical signal 38 upon reaching the closed end 126 of the light trap 120. At that low level the stray optical signal 38 is less likely to interfere with or disrupt operation of other optical devices on the substrate. If upon additional reflections a portion of the stray optical signal 38 reemerges from the light trap through its open mouth 124, it typically would be attenuated to a substantially negligible level (e.g., less than about 1% or even less than about 0.1%). In the examples shown, light collector 110b intercepts some of those portions of the stray optical signal 38 that reemerge from the light trap 120, and other such reemergent portions are intercepted by light collector 110a.

Other suitable arrangements of one or more light collectors or light traps can be employed. In one particularly simple example (not shown), the secondary waveguide 46 terminates at a transmissive end face so that the stray optical signal 38 emergent from the waveguide 46 propagates within the waveguide layers 20 directly into the open mouth 124 of a light trap 120, without being redirected by reflection from any surface 112. In other examples (not shown), one or more light collectors 110 or light traps 120 can be employed in the arrangements of FIG. 1A or 1B to contain portions of the dumped optical signal 36 or stray optical signal 38 that might be internally reflected by the edge of the waveguide layers 20.

In some instances the amount of optical signal power reaching the end face of secondary waveguide 46 (at the surface 112 of the light collector 110a as in FIG. 1B, 2A, or 2B) can be sufficient to perturb operation of the optoelectronic device (e.g., by localized heating due to optical absorption), or to cause damage to the surface 112, coating 130, or waveguide layers 20. In such an instance, the opaque coating 130 on the end face of the waveguide 46 can be chosen to be relatively higher reflecting than those described above, e.g., coating 130 can comprise gold, silver, or other highly reflective, relatively non-absorptive metal on the end face of secondary waveguide 46. The stray optical signal 38 would not be absorbed to a significant extent at the end face of waveguide 46 by such a coating. The first time optical signal 38 would encounter a partially absorptive coating 130 (e.g., within trap 120 in the exemplary arrangement of FIGS. 2A and 2B), it would have diverged to a significant extent due to unconfined propagation within waveguide layers 20. The resulting decrease in power density would reduce or eliminate problems arising from localized heating or optical damage.

A reflection suppressing layer (i.e., anti-reflection coating) can be employed as a portion of coating 130, between the lateral surface 112/122 and the metal absorbing layer. Reduction of the amount of light reflected (and concomitant increase in the amount absorbed) upon each encounter with a surface 112/122 enhances the attenuation of the stray optical signal 34 as it repeatedly encounters surfaces 112/122. Any suitable reflection suppression layer or anti-reflection coating can be employed. Some examples are disclosed in co-owned U.S. Pat. No. 7,943,229, which is hereby incorporated by reference as if fully set forth herein.

The lateral surfaces 112/122 in the examples of FIGS. 3A/3B, 4A/4B, and 5A/5B, and the end faces in the examples of 6A/6B, 7A/7B, and 8A/8B, are shown extending through the entirety of the optical waveguide layers 20 but not extending into the waveguide substrate 10. Other suitable depths can be employed within the scope of the present disclosure or appended claims, however, it is typically preferable for the lateral surface 112/122 to extend at least through the entirety of the optical waveguide layers 20. The lateral surfaces 112/122 can extend into the waveguide substrate 10. It may often occur that the optical waveguide layers 20, waveguides 40/44/46, tap 42, surfaces 112/122, and coatings 130 are formed or deposited on a wafer scale to fabricate light collectors and traps on many waveguide substrates simultaneously. The lateral surfaces 112/122 can be formed during such wafer-scale fabrication, e.g., by any suitable dry or wet etch process, typically by etching one or more trenches into the optical waveguide layers 20 (and perhaps extending into the substrate 10, as noted above).

As shown in the exemplary arrangements of FIG. 3A/3B, 4A/4B, 5A/5B, 6A/6B, 7A/7B, or 8A/8B, differing arrangements for the layer 130 can be employed. In the arrangement of FIGS. 3A/3B, the coating 130 overlies only the lateral surface 112/122; in the arrangement of FIGS. 6A/6B, the coating 130 overlies only the end face of secondary waveguide 46. Practically, that may be all that is needed, but also practically, that arrangement can be difficult to achieve, particularly using standard lithographic deposition techniques to form light collectors and traps on many waveguide substrates simultaneously. Conformal (i.e., non-directional) deposition techniques are not well-suited for selective coverage of only surfaces of a particular orientation, and directional deposition techniques are not well-suited for selective coverage of only vertical surfaces. The arrangement of FIG. 4A/4B or 7A/7B can be the easiest to achieve, by simply coating all, or nearly all, of the exposed surfaces of the waveguide substrate 10 and optical waveguide layers 20. That approach can be employed if there is no reason to avoid the presence of coating 130 over the waveguides 40 or 44 or over other portions of the waveguide substrate 10 or optical waveguide layers 20, and if a deposition can be employed that is at least somewhat conformal. An intermediate approach is illustrated by the exemplary arrangement shown in FIG. 5A/5B or 8A/8B, in which the coating 130 extends partly across horizontal surfaces of waveguide substrate 10 or optical waveguide layers 20. Portions of the substrate 10 or waveguide layers 20 can be masked to prevent deposition of the coating 130 onto areas where it would be undesirable.

Differing arrangements of the optical waveguide 44 and the optical waveguide layers 20 are shown in the exemplary arrangements of FIG. 3A/3B, 4A/4B, or 5A/5B; differing arrangements of the optical waveguide 46 and the optical waveguide layers 20 are shown in the exemplary arrangements of FIG. 6A/6B, 7A/7B, or 8A/8B. Any of the waveguide arrangements in those examples can be employed in any combination with any of the arrangements shown for coating 130 in those examples. In the examples shown in FIG. 3A/3B or 6A/6B, the optical waveguide 44 or 46 comprises a single, higher-index core between top and bottom lower-index cladding layers. A lateral surface 112 is shown near the waveguide 44 in FIG. 3A, while only the two cladding layers are present near the lateral surface 122 shown in FIG. 3B. The waveguide core and cladding layers are shown extending to the end face of waveguide 46 in FIG. 6A, but only the cladding layers reach the end face in FIG. 6B.

Figure 4A:
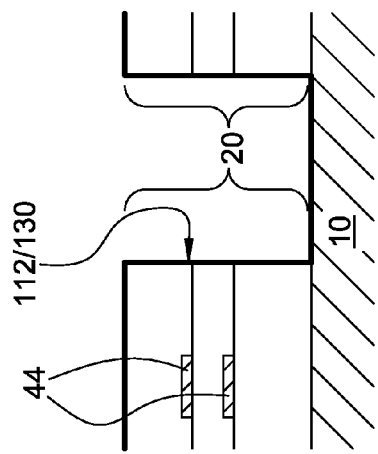
Figure 4B:
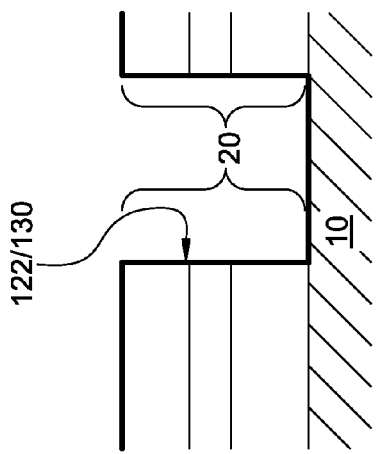
Figure 5A:
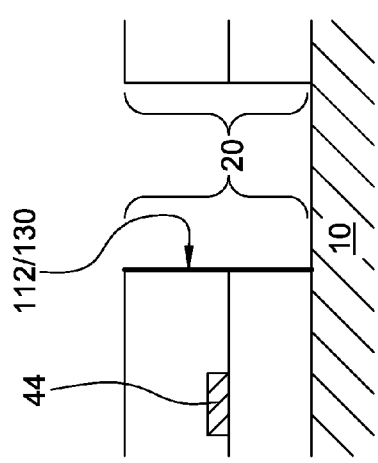
Figure 5B:
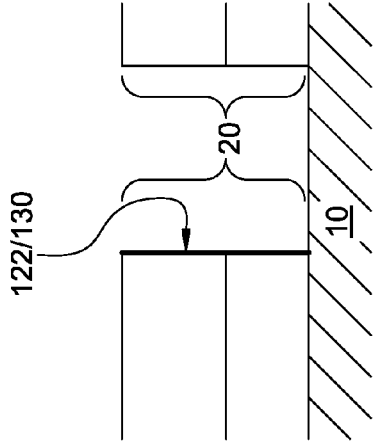
Figure 7A:
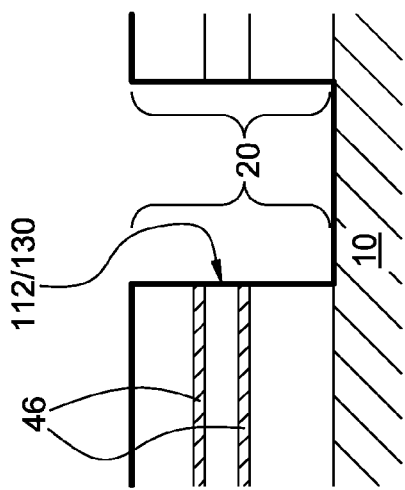
Figure 7B:
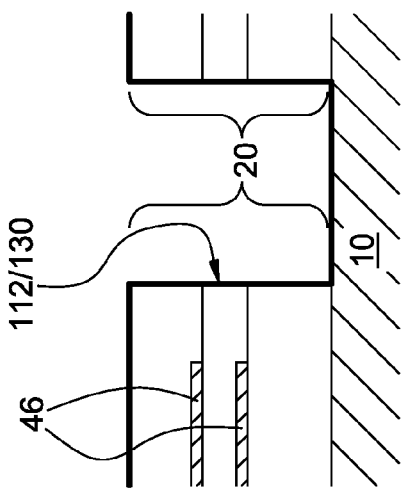
Figure 8A:
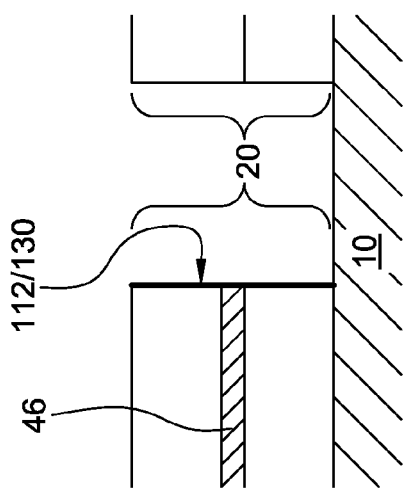
Figure 8B:
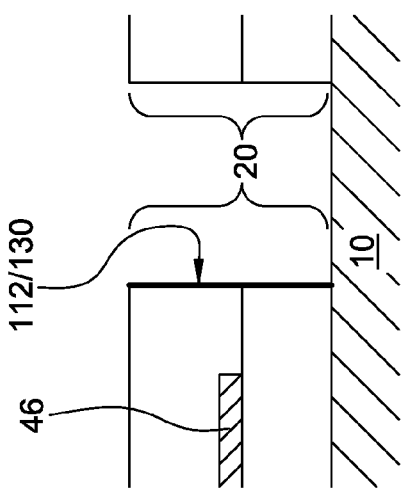

In the examples shown in FIG. 4A/4B or 7A/7B, the optical waveguide 44 or 46 comprises a pair of higher-index cores and top, middle, and bottom lower-index cladding layers. A lateral surface 112 is shown near the waveguide 44 in FIG. 4A, while only the three cladding layers are present near the lateral surface 122 shown in FIG. 4B. The waveguide core and cladding layers are shown extending to the end face of waveguide 46 in FIG. 7A, but only the cladding layers reach the end face in FIG. 7B. In the examples shown in FIG. 5A/5B or 8A/8B, the optical waveguide 44 or 46 comprises one higher-index core and two higher-index core layers, and the cladding comprises top, upper middle, lower middle, and bottom lower-index cladding layers. A lateral surface 112 is shown near the waveguide 44 in FIG. 5A, while the four cladding layers and the two core layers (without the core) are present near the surface lateral 122 shown in FIG. 5B. The waveguide core, core layers, and cladding layers are shown extending to the end face of waveguide 46 in FIG. 8A, but only the cladding layers and the two core layers (but not the core) reach the end face in FIG. 8B. Boundaries are shown between the various cladding layers to indicate where cladding deposition is interrupted to allow deposition or patterning of an intervening core or core layer, however, such boundaries may or may not be readily apparent in the finished device, particularly if the same material is used for the different cladding layers.

In addition to coating 130 on a lateral surface 112 or 122, it can be advantageous to employ an optically absorbing encapsulant (e.g., carbon particles dispersed in a silicone, epoxy, or polyurethane polymer) that substantially covers the lateral surface 112 or 122 of a light collector 110 or light trap 120. Such encapsulation (which can also serve as the index matching or absorptive medium described in connection with the arrangements of FIGS. 1A and 1B) can attenuate portions of the stray optical signal 38 that might leak through or be scattered from coating 130, thereby enhancing the performance of the light collector 110 or light trap 120 (if such enhancement is needed or desired). In one example, use of light collectors and light traps combined with use of an optically absorbing encapsulant can reduce optical cross-talk in a bidirectional optoelectronic device to a greater degree than the light collectors and trap without such encapsulation. Any suitable optically absorbing encapsulant can be employed. Some examples of suitable encapsulants are disclosed in some of the co-owned applications incorporated above; some of those examples include dual-function encapsulation that can also reduce electrical cross-talk in an optoelectronic device (if needed or desired).

In the exemplary embodiments of FIGS. 1B, 2A, and 2B, a first light collector 110a is substantially flat (in the case of FIGS. 2A and 2B, so as to redirect the stray optical signal 38 toward the open mouth of light trap 120 without substantially altering its divergence characteristics). A second light collector 110b in FIGS. 2A and 2B is curved so as to alter the divergence of a portion of the stray optical signal 38 that reemerges from the light trap 120. The illustrated shapes and arrangements of light collectors 110a and 110b are only exemplary; other shapes or arrangements of curved or straight light collector surfaces 112 can be employed as needed or desired.

To further reduce the likelihood of the stray optical signal 38 disrupting the operation of the optoelectronic device, the waveguide 44 can include a curved segment that routes the primary optical signal 34 to regions of the waveguide substrate 10 and waveguide layers 20 that are obstructed by the light collectors 110 or the light trap 120; Such an arrangement is shown in various of the drawings. Components of the optoelectronic device that the stray optical signal 38 could disturb can be positioned on such obstructed regions of the substrate 10 or waveguide layers 20. However, a curved waveguide arrangement is not always necessary or desirable; any suitable arrangement or routing of waveguides on the substrate 10 can be employed within the scope of the present disclosure or appended claims.

Figure 9A:
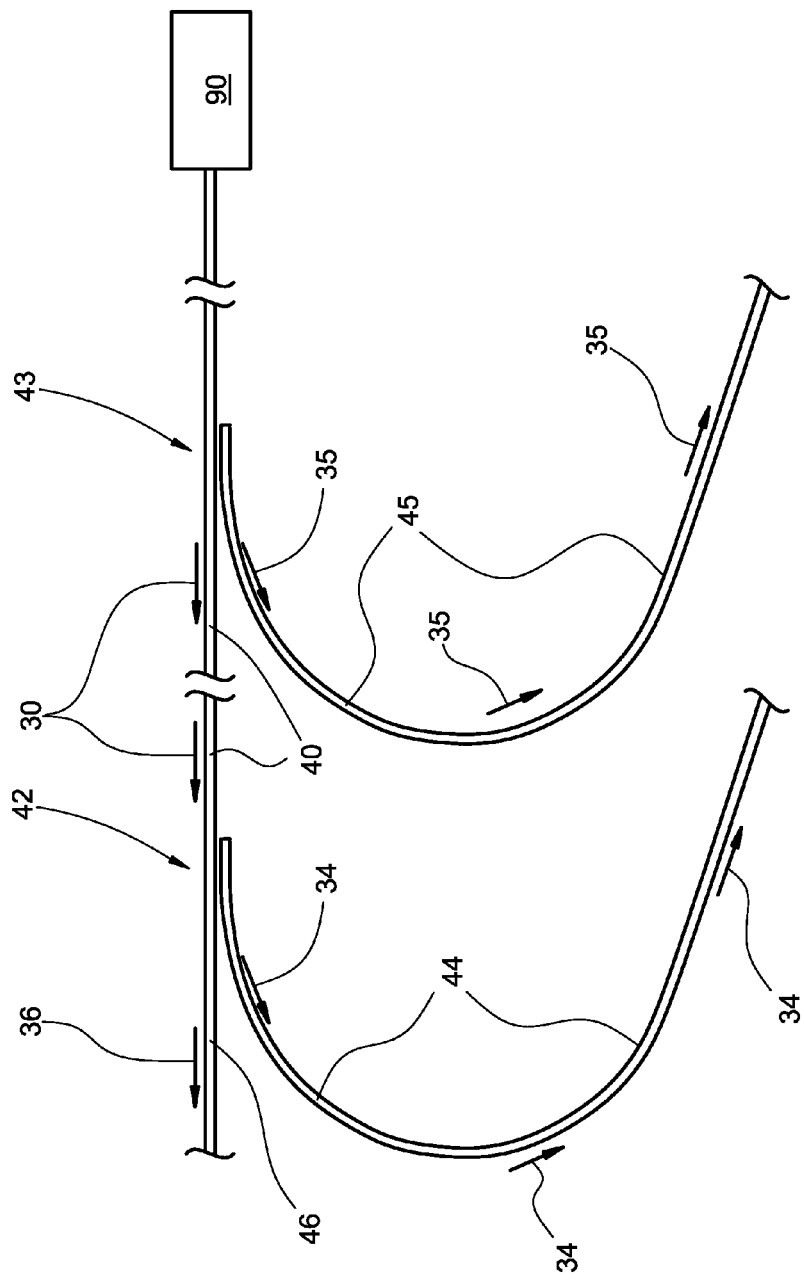
FIG. 9A is a schematic plan view of an exemplary arrangement of a light source, waveguide, waveguide tap, and monitor tap on a waveguide substrate.

In some cases, a waveguide tap 42 employed to reduce the power of the optical signal 30 exhibits a wavelength-dependent division of optical power between optical signals 34 and 36. If the wavelength of the optical signal 30 varies, the wavelength variation of the waveguide tap 42 results in power fluctuations in optical signal 34. In some instances such power fluctuations might be operationally acceptable and might not unduly degrade performance of the optoelectronic device. In other instances such power fluctuations are not acceptable. In an optoelectronic device that includes a power monitor (e.g., a monitor photodiode) and electronic feedback control of the light source, the optical signal 34 can be monitored downstream of the waveguide tap 42 (as in the exemplary arrangement of FIG. 9B). In that way, the electronic feedback control can compensate for power fluctuations arising from the wavelength dependence of the waveguide tap 42. However, in some instances adequate feedback control can be achieved by monitoring the optical signal 30 upstream of the waveguide tap 42 (as in the exemplary arrangement of FIG. 9A).

One difficulty that can arise in power monitoring and electronic feedback control of the light source is that the monitor signal power can depend on wavelength (commonly referred to as "tracking error"); such a wavelength dependence typically arises from wavelength dependence of an optical waveguide tap used to obtain the monitor optical signal. If the optical signal power levels required for laser monitoring and for transmission by the optoelectronic device are similar, then the exemplary arrangement of FIG. 9A can be employed and adapted to compensate for the wavelength dependence. To compensate for tracking error, the waveguide taps 42 and 43 can be arranged nominally identically in terms of core sizes, spacings, and materials, so that both waveguide taps exhibit the same tap ratio and wavelength dependence thereof. This of course assumes that a common tap ratio can be employed that provides a suitable optical power level for both optical signals 34 and 35. The tap 43 splits off a monitor optical signal 35 that propagates along waveguide 45 to a monitor photodetector (not shown). The tap 42 splits off a substantially identical fraction of the power remaining in the optical signal 30 to propagate as primary optical signal 34 along waveguide 44. Because the tap 42 and 43 are substantially identical, any wavelength dependence of the tap ratios will cancel out and the power in optical signals 34 and 35 will precisely track one another. Electronic feedback control using signal 35 results in substantially identical control of signal 34 (i.e., the output signal of the optoelectronic device). This particular "balanced" arrangement of the example of FIG. 9A does not depend on the placement order of the taps 42 and 43 along the waveguides 40 or 46.

Figure 9B:
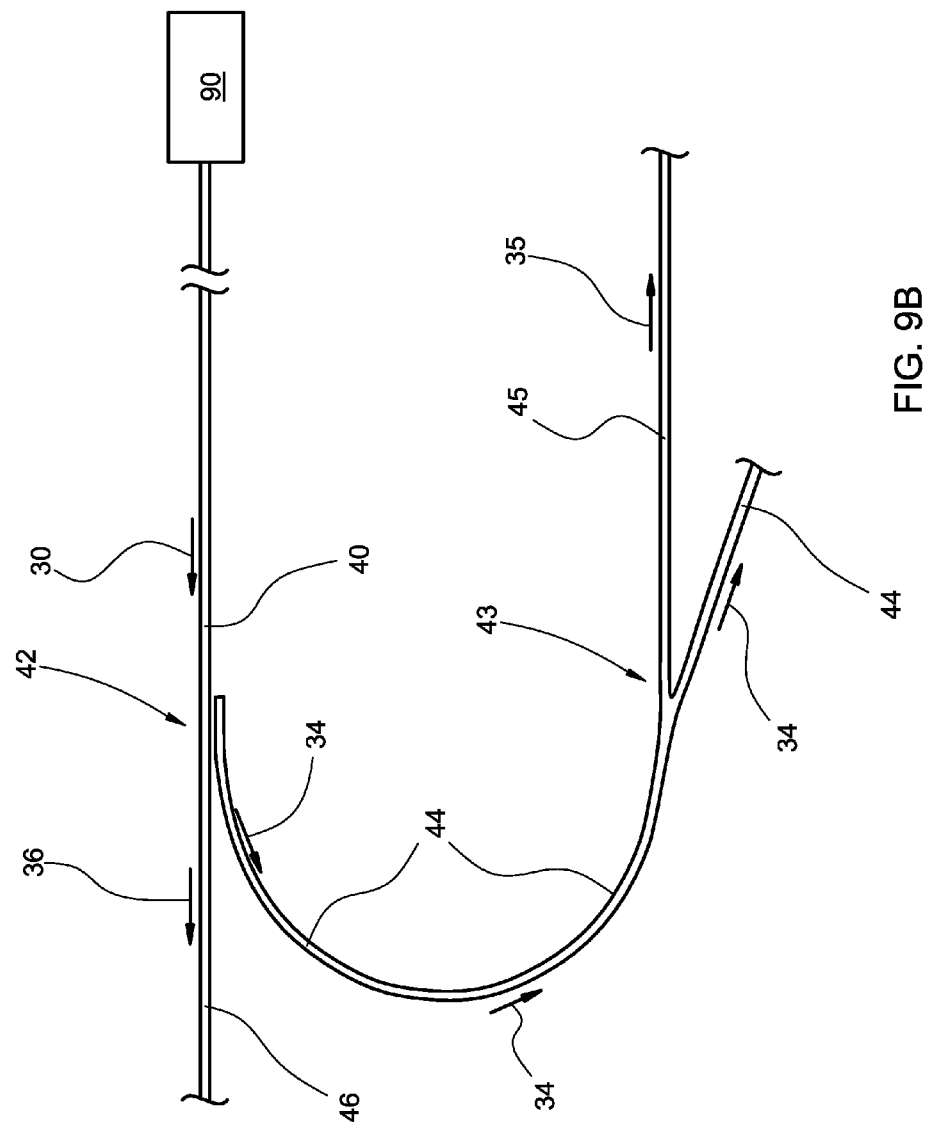
FIG. 9B is a schematic plan view of another exemplary arrangement of a light source, waveguide, waveguide tap, and monitor tap on a waveguide substrate.

The arrangement of FIG. 9B can also mitigate the effects of wavelength dependence of waveguide taps 42. Once again, if optical signal power levels for monitoring and transmission are similar, then tap 42 can be arranged to split about twice the desired fraction of optical signal 30 to propagate as primary signal 34 along waveguide 44. A substantially symmetric monitor tap or splitter 43 can be employed to evenly divide the optical signal 34: one portion propagates as monitor signal 35 along waveguide 45 to the monitor photodetector (not shown), and the second portion continues along waveguide 44 as primary optical signal 34. Again, this assumes that a common tap ratio can be employed that provides a suitable optical power level for both optical signals 34 and 35. Because splitter 43 is symmetric, it will not exhibit substantial wavelength dependence of its tap ratio, and again the optical signals 34 and 35 will precisely track one another.

In addition to the preceding, the following examples fall within the scope of the present disclosure or appended claims:

EXAMPLE 1

An optical apparatus comprising: a waveguide substrate; a set of one or more optical waveguide layers on the substrate; source, primary, and secondary optical waveguides formed in one or more of the optical waveguide layers, each of the optical waveguides being arranged to substantially confine in two transverse dimensions a corresponding guided optical mode; a light source that emits an optical signal and is arranged to launch a portion of the optical signal to propagate along the source waveguide as a source optical signal in the corresponding guided optical mode; and a first optical waveguide tap formed in one or more of the optical waveguide layers and arranged to direct a primary fraction of the source optical signal to propagate along the primary waveguide as a primary optical signal and to direct a secondary fraction of the source optical signal to propagate along the secondary waveguide as a secondary optical signal, wherein the secondary waveguide is arranged so that the secondary optical signal propagates to an end of the secondary waveguide, propagates to an edge of the waveguide substrate, and emerges from the optical waveguide layers.

EXAMPLE 2

The apparatus of Example 1 further comprising a light collector formed in the optical waveguide layers and comprising one or more lateral surfaces of the optical waveguide layers and a substantially opaque coating on the lateral surfaces, wherein the lateral surfaces of the light collector are arranged on the waveguide substrate to redirect the secondary optical signal emergent from the secondary waveguide to propagate to the edge of the waveguide substrate without confinement by any of the optical waveguides in the corresponding guided optical modes.

EXAMPLE 3

The apparatus of Example 1 further comprising one or more light traps formed in the optical waveguide layers, each light trap comprising one or more lateral surfaces of the optical waveguide layers and a substantially opaque coating on the lateral surfaces, wherein: the lateral surfaces of each light trap are arranged to define a corresponding spiral region of the optical waveguide layers, which region includes an open mouth and closed end of the light trap; and the secondary waveguide and the light trap are arranged on the waveguide substrate so that a stray optical signal reflected from an edge of the optical waveguide layers at the edge of the waveguide substrate propagates into the open mouth of the optical trap without confinement by any of the optical waveguides in the corresponding guided optical modes.

EXAMPLE 4

An optical apparatus comprising: a waveguide substrate; a set of one or more optical waveguide layers on the substrate; source, primary, and secondary optical waveguides formed in one or more of the optical waveguide layers, each of the optical waveguides being arranged to substantially confine in two transverse dimensions a corresponding guided optical mode; a light source that emits an optical signal and is arranged to launch a portion of the optical signal to propagate along the source waveguide as a source optical signal in the corresponding guided optical mode; a first optical waveguide tap formed in one or more of the optical waveguide layers and arranged to direct a primary fraction of the source optical signal to propagate along the primary waveguide as a primary optical signal and to direct a secondary fraction of the source optical signal to propagate along the secondary waveguide as a secondary optical signal; and one or more light traps formed in the optical waveguide layers, each light trap comprising one or more lateral surfaces of the optical waveguide layers and a substantially opaque coating on the lateral surfaces, wherein: the lateral surfaces of each light trap are arranged to define a corresponding spiral region of the optical waveguide layers, which region includes an open mouth and closed end of the light trap; the secondary waveguide is arranged so that the secondary optical signal propagates to an end of the secondary waveguide and emerges from the secondary waveguide to propagate as a stray optical signal in one or more of the optical waveguide layers without confinement by any of the optical waveguides in the corresponding guided optical modes; and the secondary waveguide and the light trap are arranged on the waveguide substrate so that the stray optical signal propagates into the open mouth of the optical trap without confinement by any of the optical waveguides in the corresponding guided optical modes.

EXAMPLE 5

The apparatus of Example 4 further comprising one or more light collectors formed in the optical waveguide layers, each light collector comprising one or more lateral surfaces of the optical waveguide layers and a substantially opaque coating on the lateral surfaces, wherein the lateral surfaces of each light collector are arranged on the waveguide substrate to redirect a corresponding portion of the stray optical signal to propagate into the open mouth of one of the light traps without confinement by any of the optical waveguides in the corresponding guided optical modes.

EXAMPLE 6

The apparatus of any one of Examples 2 or 5 wherein one of the light collectors is arranged on the waveguide substrate so that one of its lateral surfaces forms an at least partly reflective end face of the secondary waveguide.

EXAMPLE 7

The apparatus of Example 5 wherein at least one of the light collectors is arranged on the waveguide substrate to redirect at least a portion of the stray optical signal emerging from the mouth of the light trap to propagate back into the mouth of the light trap.

EXAMPLE 8

The apparatus of any preceding Example wherein the substrate comprises silicon or doped silicon, and one or more of the optical waveguide layers comprises silica, doped silica, silicon nitride, or silicon oxynitride.

EXAMPLE 9

The apparatus of any preceding Example wherein one or more of the optical waveguide layers comprises one or more inorganic, doped or undoped, dielectric core or cladding materials.

EXAMPLE 10

The apparatus of any preceding Example wherein one or more of the optical waveguide layers comprises one or more polymer or organic, doped or undoped, dielectric core or cladding materials.

EXAMPLE 11

The apparatus of any preceding Example wherein the one or more optical waveguide layers include one or more doped or undoped inorganic semiconductor core materials and one or more doped or undoped inorganic dielectric cladding materials.

EXAMPLE 12

The apparatus of any preceding Example wherein the one or more optical waveguide layers include one or more doped or undoped polymer or organic semiconductor core materials and one or more doped or undoped polymer or organic dielectric cladding materials.

EXAMPLE 13

The apparatus of any preceding Example wherein the light source comprises a laser diode or a light emitting diode.

EXAMPLE 14

The apparatus of any preceding Example wherein the light source is positioned on the substrate or on one or more of the waveguide layers.

EXAMPLE 15

The apparatus of any one of Examples 2 through 14 wherein one or more of the lateral surfaces of the light collectors or the light traps comprise etched edges of one or more of the optical waveguide layers.

EXAMPLE 16

The apparatus of any one of Examples 2 through 15 wherein the substantially opaque coatings of one or more of the lateral surfaces of the light collectors or light traps include a metal layer.

EXAMPLE 17

The apparatus of Example 16 wherein the metal layer is at least partly absorptive.

EXAMPLE 18

The apparatus of any one of Examples 16 or 17 wherein the metal layer is at least partly reflective.

EXAMPLE 19

The apparatus of Example 16 wherein the metal layer is at least partly absorptive, and the substantially opaque coating includes a reflection suppressing layer between the lateral surface and the metal layer.

EXAMPLE 20

The apparatus of any one of Examples 3 through 19 wherein the spiral region subtends an arc greater than about 180°.

EXAMPLE 21

The apparatus of any one of Examples 3 through 20 wherein at least a portion of the spiral region is a cornuate spiral region.

EXAMPLE 22

The apparatus of any preceding Example further comprising an optically absorptive encapsulant that substantially covers (i) one or more edges of the waveguide layers at the edge of the waveguide substrate or (ii) one or more of the lateral surfaces of one or more of the light traps or light collectors.

EXAMPLE 23

The apparatus of Example 22 wherein the encapsulant comprises a silicone, epoxy, or polyurethane polymer.

EXAMPLE 24

The apparatus of Example 23 wherein the encapsulant further comprises carbon particles dispersed in the polymer.

EXAMPLE 25

The apparatus of any preceding Example further comprising a second optical waveguide tap arranged to direct a monitor fraction of (i) the optical signal propagating along the source waveguide, or (ii) the secondary optical signal propagating along the secondary waveguide, to propagate along a monitor optical waveguide to a monitor photodetector.

EXAMPLE 26

The apparatus of Example 25 wherein the second optical waveguide tap is substantially identical to the first optical waveguide tap.

EXAMPLE 27

The apparatus of any one of Examples 1 through 24 further comprising a second optical waveguide tap, wherein the second optical waveguide tap is substantially symmetric and is arranged to divide the primary optical signal into substantially equal first and second fractions that propagate (i) along the monitor optical waveguide to a monitor photodetector and (ii) along an extension of the primary waveguide beyond the second optical waveguide tap, respectively.

EXAMPLE 28

A method for making the optical apparatus of any preceding Example, the method comprising: forming source, primary, and secondary optical waveguides in one or more of a set of optical waveguide layers formed on a waveguide substrate; arranging a light source to launch a source optical signal to propagate along the source waveguide in the corresponding guided optical mode; and forming an optical waveguide tap in one or more of the optical waveguide layers and arranging the tap to direct a primary fraction of the source optical signal to propagate along the primary waveguide as a primary optical signal and to direct a secondary fraction of the source optical signal to propagate along the secondary waveguide as a secondary optical signal, and further comprising: arranging the secondary waveguide so that the secondary optical signal propagates to an end of the secondary waveguide, propagates to an edge of the waveguide substrate, and emerges from the optical waveguide layers; or forming one or more light traps in the optical waveguide layers, each light trap comprising one or more lateral surfaces of the optical waveguide layers and a substantially opaque coating on the lateral surfaces.

EXAMPLE 29

A method for using the apparatus of any preceding Example comprising operating the light source to launch the source optical signal to propagate along the source waveguide in the corresponding guided optical mode.

It is intended that equivalents of the disclosed exemplary embodiments and methods shall fall within the scope of the present disclosure or appended claims. It is intended that the disclosed exemplary embodiments and methods, and equivalents thereof, may be modified while remaining within the scope of the present disclosure or appended claims.

In the foregoing Detailed Description, various features may be grouped together in several exemplary embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed exemplary embodiment. Thus, the appended claims are hereby incorporated into the Detailed Description, with each claim standing on its own as a separate disclosed embodiment. However, the present disclosure shall also be construed as implicitly disclosing any embodiment having any suitable set of one or more disclosed or claimed features (i.e., sets of features that are not incompatible or mutually exclusive), including those sets that may not be explicitly disclosed herein. It should be further noted that the scope of the appended claims do not necessarily encompass the whole of the subject matter disclosed herein.

For purposes of the present disclosure and appended claims, the conjunction "or" is to be construed inclusively (e.g., "a dog or a cat" would be interpreted as "a dog, or a cat, or both"; e.g., "a dog, a cat, or a mouse" would be interpreted as "a dog, or a cat, or a mouse, or any two, or all three"), unless: (i) it is explicitly stated otherwise, e.g., by use of "either . . . or," "only one of," or similar language; or (ii) two or more of the listed alternatives are mutually exclusive within the particular context, in which case "or" would encompass only those combinations involving non-mutually-exclusive alternatives. For purposes of the present disclosure or appended claims, the words "comprising," "including," "having," and variants thereof, wherever they appear, shall be construed as open ended terminology, with the same meaning as if the phrase "at least" were appended after each instance thereof.

In the appended claims, if the provisions of 35 USC §112 ¶ 6 are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC §112 ¶ 6 are not intended to be invoked for that claim.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. An optical apparatus comprising:
   a waveguide substrate;
   a set of one or more optical waveguide layers on the substrate;
   source, primary, and secondary optical waveguides formed in one or more of the optical waveguide layers, each of the optical waveguides being arranged to substantially confine in two transverse dimensions a corresponding guided optical mode;

a light source that emits an optical signal and is arranged to launch a portion of the optical signal to propagate along the source waveguide as a source optical signal in the corresponding guided optical mode;

a first optical waveguide tap formed in one or more of the optical waveguide layers and arranged to direct a primary fraction of the source optical signal to propagate along the primary waveguide as a primary optical signal and to direct a secondary fraction of the source optical signal to propagate along the secondary waveguide as a secondary optical signal; and one or more light traps formed in the optical waveguide layers, each light trap comprising one or more lateral surfaces of the optical waveguide layers and a substantially opaque coating on the lateral surfaces, wherein:

the lateral surfaces of each light trap are arranged to define a corresponding spiral region of the optical waveguide layers, which region includes an open mouth and closed end of the light trap;

the secondary waveguide is arranged so that the secondary optical signal propagates to an end of the secondary waveguide and emerges from the secondary waveguide to propagate as a stray optical signal in one or more of the optical waveguide layers without confinement by any of the optical waveguides in the corresponding guided optical modes; and the secondary waveguide and the light trap are arranged on the waveguide substrate so that the stray optical signal propagates into the open mouth of the optical trap without confinement by any of the optical waveguides in the corresponding guided optical modes.

2. The apparatus of claim 1 further comprising one or more light collectors formed in the optical waveguide layers, each light collector comprising one or more lateral surfaces of the optical waveguide layers and a substantially opaque coating on the lateral surfaces, wherein the lateral surfaces of each light collector are arranged on the waveguide substrate to redirect a corresponding portion of the stray optical signal to propagate into the open mouth of one of the light traps without confinement by any of the optical waveguides in the corresponding guided optical modes.

3. The apparatus of claim 2 wherein one of the light collectors is arranged on the waveguide substrate so that one of its lateral surfaces forms an at least partly reflective end face of the secondary waveguide.

4. The apparatus of claim 2 wherein at least one of the light collectors is arranged on the waveguide substrate to redirect at least a portion of the stray optical signal emerging from the mouth of the light trap to propagate back into the mouth of the light trap.

5. The apparatus of claim 1 wherein the light source is positioned on the substrate or on one or more of the waveguide layers.

6. The apparatus of claim 1 wherein one or more of the lateral surfaces of the one or more light traps comprise etched edges of one or more of the optical waveguide layers.

7. The apparatus of claim 1 wherein the substantially opaque coatings of one or more of the lateral surfaces of the one or more light traps include a metal layer.

8. The apparatus of claim 7 wherein the metal layer is at least partly absorptive.

9. The apparatus of claim 7 wherein the metal layer is at least partly reflective.

10. The apparatus of claim 7 wherein the metal layer is at least partly absorptive, and the substantially opaque coating includes a reflection suppressing layer between the lateral surface and the metal layer.

11. The apparatus of claim 1 wherein the spiral region subtends an arc greater than about 180°.

12. The apparatus of claim 1 wherein at least a portion of the spiral region is a cornuate spiral region.

13. The apparatus of claim 1 further comprising an optically absorptive encapsulant that substantially covers (i) one or more edges of the waveguide layers at the edge of the waveguide substrate or (ii) one or more of the lateral surfaces of one or more of the light traps.

14. The apparatus of claim 13 wherein the encapsulant comprises a silicone, epoxy, or polyurethane polymer.

15. The apparatus of claim 14 wherein the encapsulant further comprises carbon particles dispersed in the polymer.

16. The apparatus of claim 1 further comprising a second optical waveguide tap arranged to direct a monitor fraction of (i) the optical signal propagating along the source waveguide, or (ii) the secondary optical signal propagating along the secondary waveguide, to propagate along a monitor optical waveguide to a monitor photodetector.

17. The apparatus of claim 16 wherein the second optical waveguide tap is substantially identical to the first optical waveguide tap.

18. The apparatus of claim 1 further comprising a second optical waveguide tap, wherein the second optical waveguide tap is substantially symmetric and is arranged to divide the primary optical signal into substantially equal first and second fractions that propagate (i) along the monitor optical waveguide to a monitor photodetector and (ii) along an extension of the primary waveguide beyond the second optical waveguide tap, respectively.

19. A method for making an optical apparatus, the method comprising:

forming source, primary, and secondary optical waveguides in one or more of a set of optical waveguide layers formed on a waveguide substrate;

arranging a light source to launch a source optical signal to propagate along the source waveguide in the corresponding guided optical mode;

forming an optical waveguide tap in one or more of the optical waveguide layers and arranging the tap to direct a primary fraction of the source optical signal to propagate along the primary waveguide as a primary optical signal and to direct a secondary fraction of the source optical signal to propagate along the secondary waveguide as a secondary optical signal; and forming one or more light traps in the optical waveguide layers, each light trap comprising one or more lateral surfaces of the optical waveguide layers and a substantially opaque coating on the lateral surfaces, wherein:

the lateral surfaces of each light trap are arranged to define a corresponding spiral region of the optical waveguide layers, which region includes an open mouth and closed end of the light trap;

the secondary waveguide is arranged so that the secondary optical signal propagates to an end of the secondary waveguide and emerges from the secondary waveguide to propagate as a stray optical signal in one or more of the optical waveguide layers without confinement by any of the optical waveguides in the corresponding guided optical modes; and the secondary waveguide and the light trap are arranged on the waveguide substrate so that the stray optical signal propagates into the open mouth of the optical trap without confinement by any of the optical waveguides in the corresponding guided optical modes.

20. A method for using an optical apparatus, the method comprising operating a light source to launch a source optical signal to propagate along a source waveguide in a corresponding guided optical mode, wherein the optical apparatus comprises:

a waveguide substrate;

a set of one or more optical waveguide layers on the substrate;

the source optical waveguide, a primary optical waveguide, and a secondary optical waveguide formed in one or more of the optical waveguide layers, each of the optical waveguides being arranged to substantially confine in two transverse dimensions a corresponding guided optical mode;

the light source emits an optical signal and is arranged to launch a portion of the optical signal to propagate along the source waveguide as the source optical signal in the corresponding guided optical mode;

a first optical waveguide tap formed in one or more of the optical waveguide layers and arranged to direct a primary fraction of the source optical signal to propagate along the primary waveguide as a primary optical signal and to direct a secondary fraction of the source optical signal to propagate along the secondary waveguide as a secondary optical signal; and one or more light traps formed in the optical waveguide layers, each light trap comprising one or more lateral surfaces of the optical waveguide layers and a substantially opaque coating on the lateral surfaces, wherein:

the lateral surfaces of each light trap are arranged to define a corresponding spiral region of the optical waveguide layers, which region includes an open mouth and closed end of the light trap;

the secondary waveguide is arranged so that the secondary optical signal propagates to an end of the secondary waveguide and emerges from the secondary waveguide to propagate as a stray optical signal in one or more of the optical waveguide layers without confinement by any of the optical waveguides in the corresponding guided optical modes; and the secondary waveguide and the light trap are arranged on the waveguide substrate so that the stray optical signal propagates into the open mouth of the optical trap without confinement by any of the optical waveguides in the corresponding guided optical modes.

21. An optical apparatus comprising:

a waveguide substrate;

a set of one or more optical waveguide layers on the substrate;

source, primary, and secondary optical waveguides formed in one or more of the optical waveguide layers, each of the optical waveguides being arranged to substantially confine in two transverse dimensions a corresponding guided optical mode;

a light source that emits an optical signal and is arranged to launch a portion of the optical signal to propagate along the source waveguide as a source optical signal in the corresponding guided optical mode;

a first optical waveguide tap formed in one or more of the optical waveguide layers and arranged to direct a primary fraction of the source optical signal to propagate along the primary waveguide as a primary optical signal and to direct a secondary fraction of the source optical signal to propagate along the secondary waveguide as a secondary optical signal; and one or more light traps formed in the optical waveguide layers, each light trap comprising one or more lateral surfaces of the optical waveguide layers and a substantially opaque coating on the lateral surfaces, wherein:

the secondary waveguide is arranged so that the secondary optical signal propagates to an end of the secondary waveguide, propagates to an edge of the waveguide substrate, and emerges from the optical waveguide layers;

the lateral surfaces of each light trap are arranged to define a corresponding spiral region of the optical waveguide layers, which region includes an open mouth and closed end of the light trap; and the secondary waveguide and the light trap are arranged on the waveguide substrate so that a stray optical signal reflected from an edge of the optical waveguide layers at the edge of the waveguide substrate propagates into the open mouth of the optical trap without confinement by any of the optical waveguides in the corresponding guided optical modes.

22. The apparatus of claim 21 further comprising a light collector formed in the optical waveguide layers and comprising one or more lateral surfaces of the optical waveguide layers and a substantially opaque coating on the lateral surfaces, wherein the lateral surfaces of the light collector are arranged on the waveguide substrate to redirect the secondary optical signal emergent from the secondary waveguide to propagate to the edge of the waveguide substrate without confinement by any of the optical waveguides in the corresponding guided optical modes.

* * * * *